(12) United States Patent
Maeno

(10) Patent No.: US 6,664,629 B2
(45) Date of Patent: *Dec. 16, 2003

(54) SEMICONDUCTOR DEVICE

(75) Inventor: Kazuhiro Maeno, Aichi-ken (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/156,620

(22) Filed: May 28, 2002

(65) Prior Publication Data

US 2002/0180036 A1 Dec. 5, 2002

(30) Foreign Application Priority Data

May 29, 2001 (JP) ........................................ 2001-159765

(51) Int. Cl.[7] .............................................. H01L 23/34
(52) U.S. Cl. .......................... 257/723; 257/693; 257/698
(58) Field of Search ................................ 257/723, 693, 257/698

(56) References Cited

U.S. PATENT DOCUMENTS

| 5,530,282 | A | * | 6/1996 | Tsuji | 257/666 |
| 5,714,787 | A | * | 2/1998 | Eguchi et al. | 257/394 |
| 6,388,316 | B1 | * | 5/2002 | Matsumoto | 257/700 |
| 2002/0158327 | A1 | * | 10/2002 | Maeno et al. | 257/698 |

FOREIGN PATENT DOCUMENTS

JP  6-283639  10/1994  ........... H01L/23/48

* cited by examiner

Primary Examiner—David Nelms
Assistant Examiner—Andy Huynh
(74) Attorney, Agent, or Firm—Morgan & Finnegan, LLP

(57) ABSTRACT

A plurality of semiconductor elements are arranged on the top surface of a heat conductive base plate. A resin case is attached to the heat conductive base plate so as to encompass the plurality of semiconductor elements. A metal member including a bridge electrode is incorporated into the resin case. The bridge electrode is electrically connected to a corresponding semiconductor area through bonding wire. An external terminal is incorporated into the bridge electrode.

6 Claims, 11 Drawing Sheets

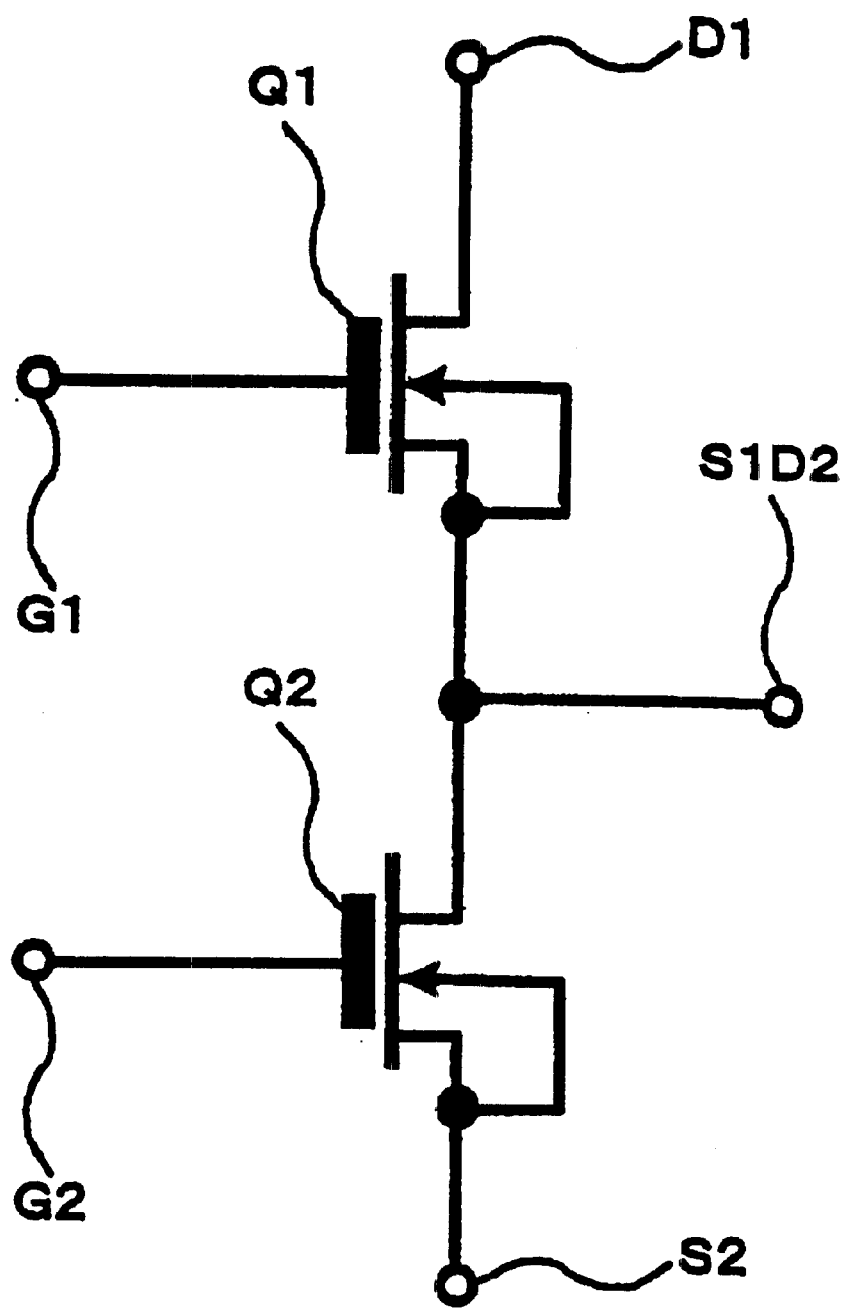
F I G. 3

SEMICONDUCTOR DEVICE

BACKGROUND OF THE INVENTION

1. Field of the Invention

The present invention relates to a semiconductor device containing a plurality of transistors, and more specifically to the structure of the electrode of the semiconductor device.

2. Description of the Related Art

In accordance with the present trend toward smaller electronic equipment, a semiconductor device configured by a smaller module containing a plurality of heat-producing semiconductor elements is demanded.

An existing semiconductor device (power module) is described below by referring to FIGS. 1 and 2. A power module 51 includes a plurality of semiconductor elements. To the bottom of the power module 51, a heat conductive base plate 52 formed by a heat conductive ceramic plate is attached as a heat conductive member.

On the top surface of the heat conductive base plate 52, a substrate 55 and a substrate 56 are provided. The substrate 55 is formed by a conductor layer 55a and an insulating layer 55b, and the insulating layer 55b is in contact with the heat conductive base plate 52. On the other hand, the substrate 56 is formed by a conductor layer 56a and an insulating layer 56b, and the insulating layer 56b is in contact with the heat conductive base plate 52. A plurality of semiconductor elements 57 are provided on the top surface of the conductor layer 55a, and a plurality of semiconductor elements 58 are provided on the top surface of conductor layer 56a. The semiconductor elements 57 and 58 are MOSFETs. A drain of the MOSFET is formed on one surface of each of the semiconductor elements 57 and 58, and a source and a gate are formed on the other surface of the MOSFET. The drain of each semiconductor element 57 is in contact with the conductor layer 55a of the substrate 55, and the drain of each semiconductor element 58 is in contact with the conductor layer 56a of the substrate 56.

A substrate 53 is provided in the central area on the top surface of the heat conductive base plate 52. The substrate 53 is formed by a conductor layer 53a and an insulating layer 53b, and the insulating layer 53b is in contact with the heat conductive base plate 52. A source-drain electrode 54 is connected to the conductor layer 53a.

The substrates 55, 56, and 53 (and semiconductor elements 57 and 58) are encompassed by a resin case 59. A drain electrode 60, a source electrode 61, and gate electrodes 62 and 63 are attached to the resin case 59. The resin case 59 is fixed to the heat conductive base plate 52.

As shown in FIGS. 1 and 2, wire bonding connects the drain electrode 60 with the conductor layer 55a of the substrate 55, the source of each semiconductor element 57 with the conductor layer 53a of the substrate 53, the conductor layer 53a with the conductor layer 56a of the substrate 56, the source of the semiconductor element 58 with the source electrode 61, the gate of the semiconductor element 57 with the gate electrode 62, and the gate of each semiconductor element 58 with the gate electrode 63.

In this semiconductor device, if the substrates 53, 55, and 56 are made small, then a smaller power module can be produced. However, it is necessary for the substrate 53 to reserve an area for wire bonding and an area for the source-drain electrode 54. In addition, it is necessary to increase the number of the semiconductor elements 57 and 58 in order to increase the capacity of the power module 51, thereby also requiring larger substrates 55 and 56. As a result, there has been a lower limit for the size of the substrates 53, 55, and 56. That is, it has not been easy to realize a smaller semiconductor device such as a power module, etc.

SUMMARY OF THE INVENTION

The present invention aims at downsizing a semiconductor power module including a plurality of semiconductor elements.

The semiconductor device according to the present invention includes a plurality of semiconductor elements, a case provided as encompassing the plurality of semiconductor elements, and an electrode which is incorporated into the case for the main current of the semiconductor elements. These components are arranged such that the electrode bridges over the area of the semiconductor elements when the case is fixed in a predetermined position for the semiconductor elements.

According to this structure, the semiconductor elements (or their circuits) can be provided under the electrode. Therefore, a smaller semiconductor device can be realized. In addition, since the electrode is incorporated into the case, the assembly task for the semiconductor device can be simpler.

This semiconductor device can be configured such that the terminals for electric connection between the semiconductor device and the circuits outside the semiconductor device can also be incorporated into the electrode. With the configuration, since it is not necessary to connect the electrode to the terminals, the assembly task for the semiconductor device can be yet simpler.

This semiconductor device can also be configured such that the electrode can be connected to the semiconductor elements through wire bonding. With the configuration, the space in the case can be efficiently utilized.

This semiconductor device can be configured such that the electrode can directly or indirectly contact the metal contact surface provided in a predetermined position for the semiconductor elements so that the metal contact surface is connected to the semiconductor elements through the wire bonding. With the configuration, the wire can be applied before fixing the case, thereby realizing an easier bonding operation.

Furthermore, this semiconductor device can also be configured such that partitioning members for sectioning the area inside the case can be provided at the bottom portion of the electrode. With the configuration, a gel, if it is filled inside the case, can be protected against shaking. As a result, an excess tension on the wire can be avoided.

BRIEF DESCRIPTION OF THE DRAWINGS

FIG. 3 shows the circuit formed inside the semiconductor device according to an embodiment of the present invention;

DESCRIPTION OF THE PREFERRED EMBODIMENTS

The embodiments of the present invention are described below by referring to the attached drawings. The semiconductor device according to the present invention is a power module including a plurality of semiconductor elements.

FIG. 3 shows the circuit formed inside the semiconductor device according to an embodiment of the present invention. The circuit shown in FIG. 3 comprises a set of a transistor Q1 and a transistor Q2 connected in series to each other. In the description below, the drain of the transistor Q1 is referred to as a drain D1, the gate of the transistor Q1 is referred to as a first gate G1, the gate of the transistor Q2 is referred to as a second gate G2, the source of the transistor Q2 is referred to as a source S2, and the connection node between the transistor Q1 and the transistor Q2 is referred to as a source-drain S1D2 hereinafter. Each of the transistors Q1 and Q2 comprises a plurality of MOSFETs connected to one another in parallel.

In this circuit, if the transistor Q1 is controlled to be ON state while the transistor Q2 is controlled to be OFF state, then the main current flows from the drain D1 to the source-drain S1D2 through the transistor Q1. If the transistor Q1 is controlled to be OFF state while the transistor Q2 is controlled to be ON state, then the main current flows from the source-drain S1D2 to the source S2 through the transistor Q2.

Figure 1:
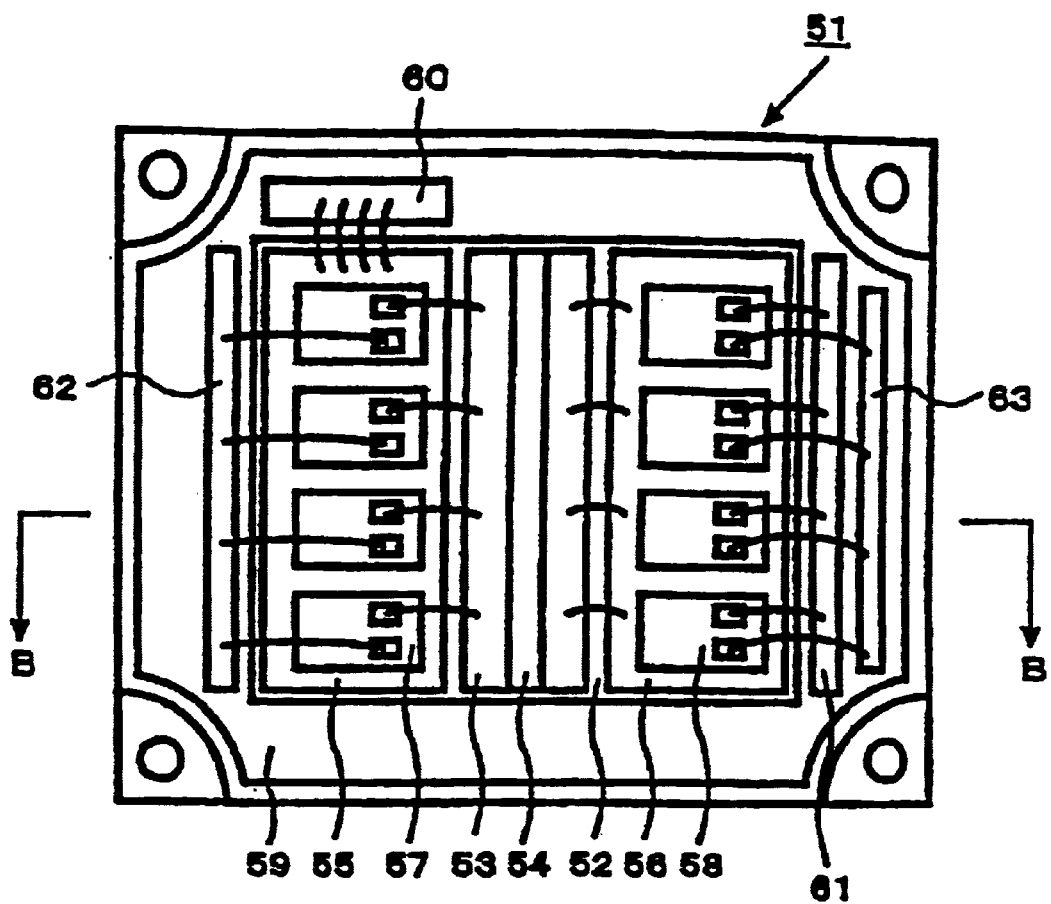
FIG. 1 is a top view of the inside of an existing semiconductor device.
Figure 2:
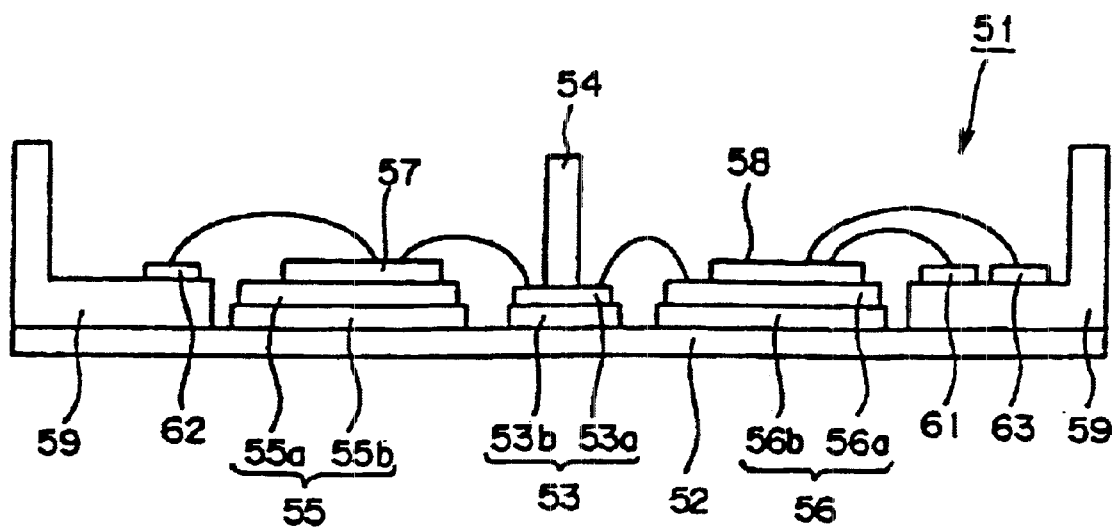
FIG. 2 is a sectional view along the line B—B of the semiconductor device shown in FIG. 1.
Figure 4:
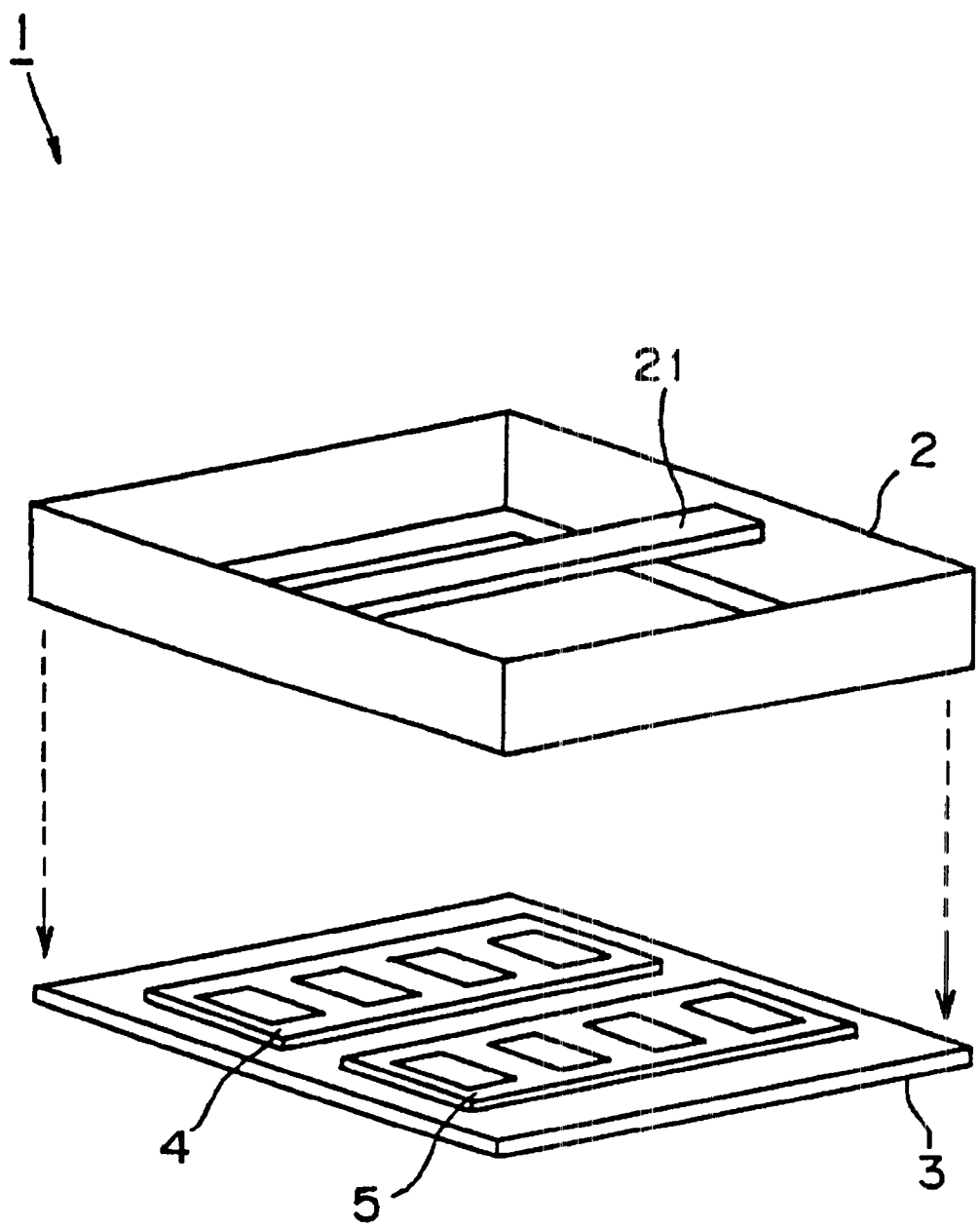
FIG. 4 shows the exterior view of the semiconductor device according to an embodiment of the present invention.

FIG. 4 shows the exterior view of the semiconductor device according to an embodiment of the present invention. A power module 1, which is a semiconductor device, comprises substrates 4 and 5 provided with semiconductor elements, a resin case 2 fixed to a heat conductive plate 3 such that the plurality of semiconductor element can be encompassed, etc. To the resin case 2, a source electrode 21 is incorporated. The electrode incorporated into the resin case 2 is often referred to as an inserted electrode. A plurality of semiconductor elements provided on the top surface of the substrates 4 and 5 forms the circuit shown in FIG. 3 by appropriately connected. The resin case 2 is provided with a source-drain electrode, a drain electrode, and gate electrodes. These electrodes are electrically connected to the corresponding areas. The source electrode 21 is described later in detail, but is electrically connected to the source S2 shown in FIG. 3.

Figure 5A:
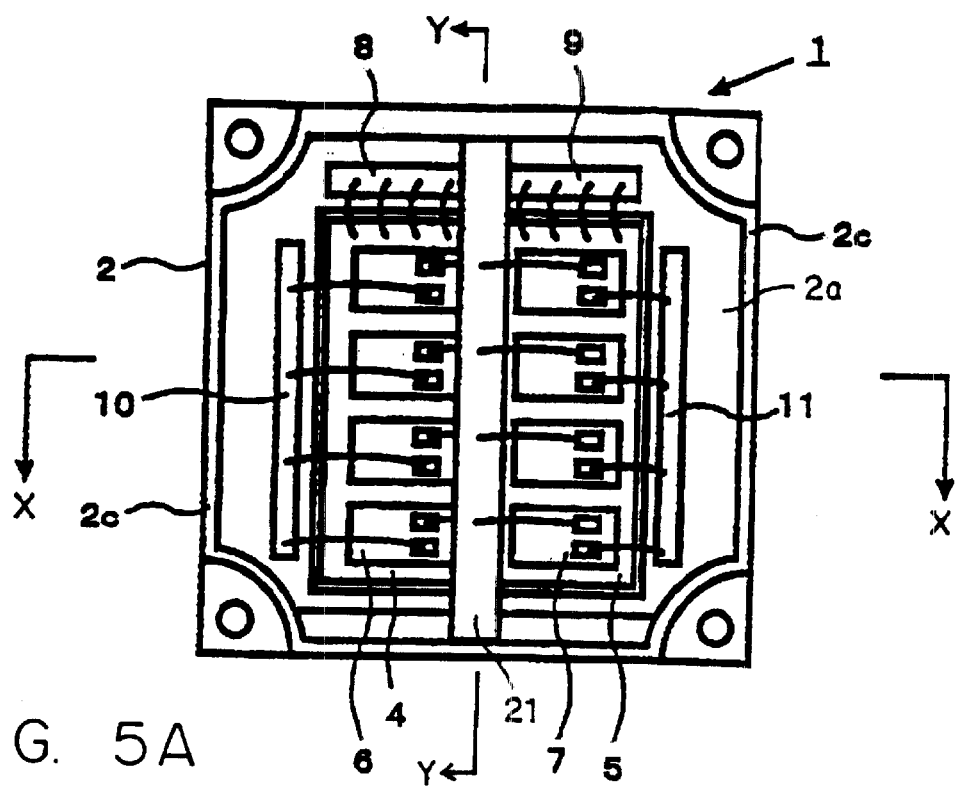
FIG. 5A is a top view of the inside of a power module.
Figure 5B:
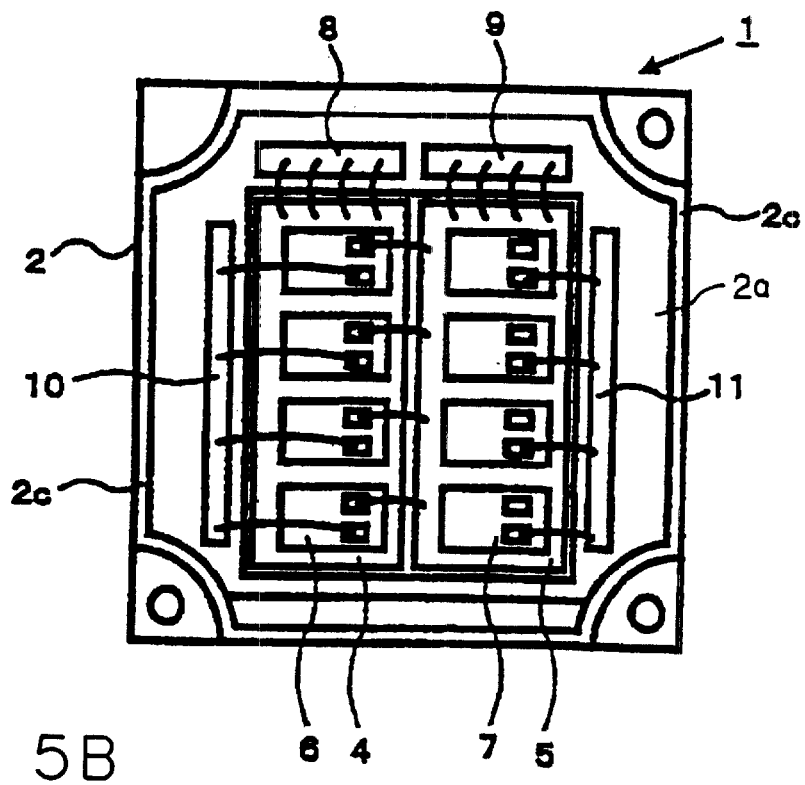
FIG. 5B is a top view of the inside the power module when there is no source electrode.
Figure 6:
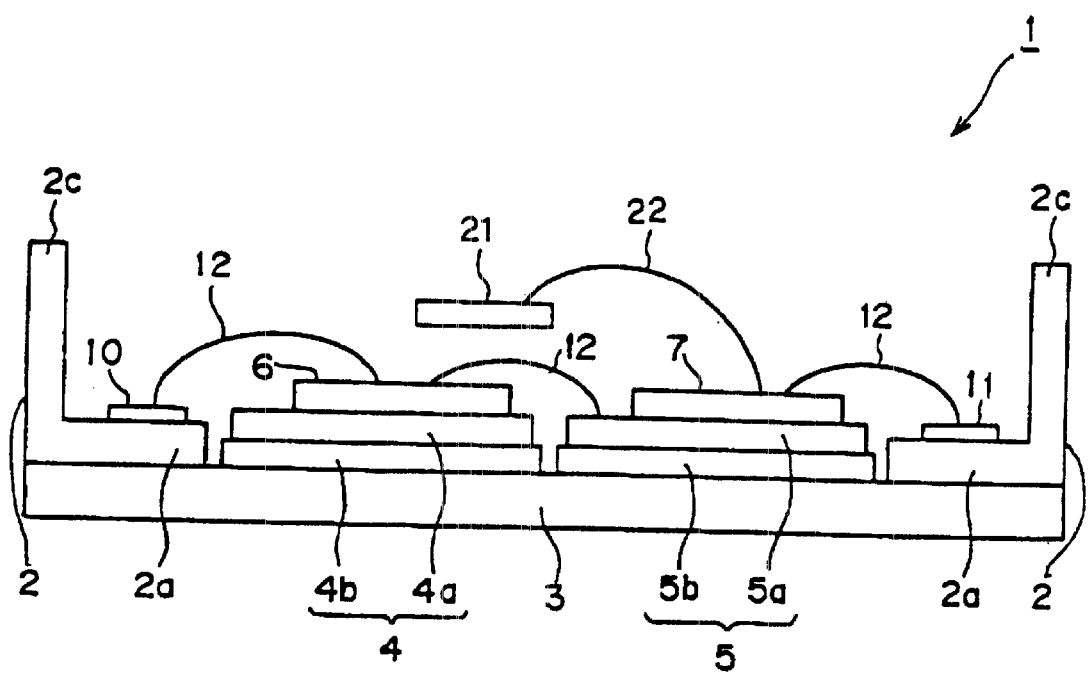
FIG. 6 is a sectional view along the line X—X of the semiconductor device shown in FIG. 5A.
Figure 7:
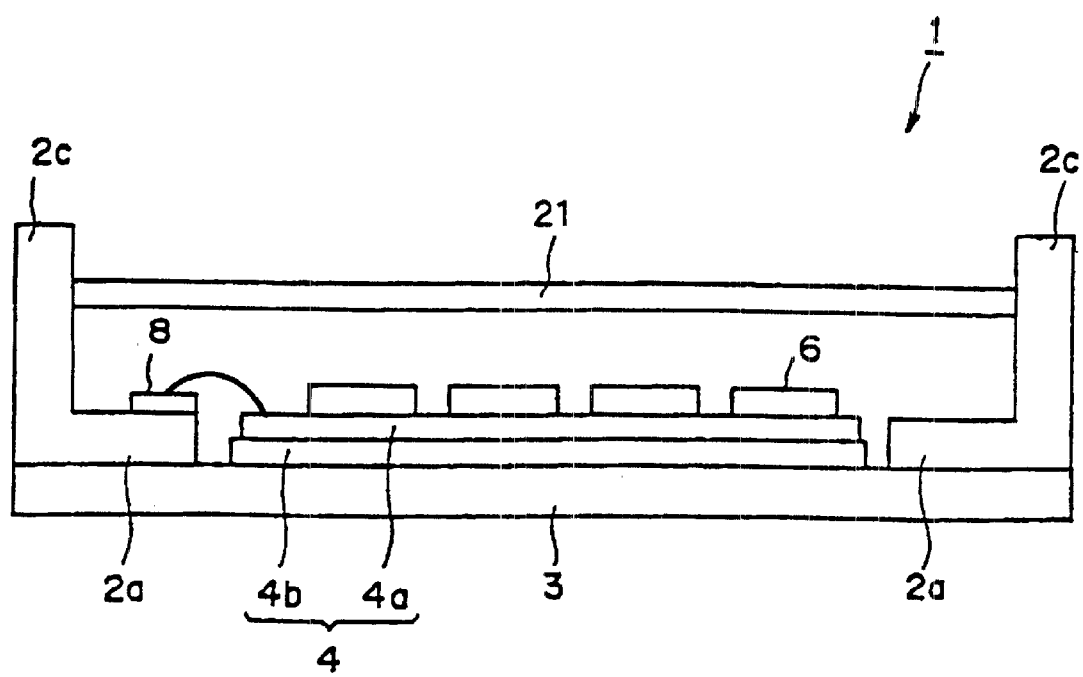
FIG. 7 is a sectional view along the line Y—Y of the semiconductor device shown in FIG. 5A.

FIG. 5A is a top view of the inside of the power module 1. FIG. 5B is a top view of the inside of the power module 1 on the assumption that there is no source electrode 21. FIG. 6 is a sectional view of the power module shown in FIG. 5A along the line X—X. FIG. 7 is a sectional view of the power module shown in FIG. 5A along the line Y—Y.

The heat conductive plate 3 can be, for example, a heat conductive ceramic plate, and a substrate on which a plurality of semiconductor elements are arranged and radiating heat generated by the semiconductor elements. The ceramic plate can be formed by ceramic of C-A1. It is not always necessary for the heat conductive plate 3 to be ceramic, but the plate can be a metal plate of copper, aluminum, etc.

The substrates 4 and 5 are provided on the top surface of the heat conductive plate 3. The substrates 4 and 5 are rectangular, and adjacently arranged parallel to each other. The substrate 4 comprises a conductor layer 4a and an insulating layer 4b for electrically insulating the conductor layer 4a from the heat conductive plate 3. On the other hand, the substrate 5 comprises a conductor layer 5a and an insulating layer 5b for electrically insulating the conductor 5a from the heat conductive plate 3.

A plurality of semiconductor elements 6 are arranged on the surface of the conductor layer 4a. The semiconductor elements 6 are semiconductor chips forming a MOSFET, and a source and a gate of the MOSFET are formed on the top surface of the chip, and a drain is formed on its bottom surface. There is conductivity between the drain of each of the semiconductor elements (MOSFET) 6 and the conductor layer 4a. Similarly, the semiconductor elements 7 are arranged on the top surface of the substrate 5, and each drain of the semiconductor elements 7 is in contact with the conductor layer 5a. The semiconductor elements 7 as well as the semiconductor elements 6 form MOSFETs.

The resin case 2 is a member which encompasses the substrates 4 and 5 (including the semiconductor elements 6 and 7) when it is attached to the heat conductive plate 3, and comprises a bottom portion 2a and a frame portion 2c. The bottom portion 2a c contacts with the heat conductive plate 3. In the central area of the bottom portion 2a, a hole larger than the area on which the substrates 4 and 5 are mounted in the surface of the heat conductive plate 3 is formed. The frame portion 2c is formed to extend in a direction perpendicular to the bottom portion 2a along the outer region of the bottom portion 2a. That is, the frame portion 2c is located in the outer region of the heat conductive plate 3 when the resin case 2 is attached to the heat conductive plate 3.

A drain electrode 8 is located in the position adjacent to the substrate 4 on the top surface of the bottom portion 2a, and a source-drain electrode 9 is located in the position adjacent to the substrate 5 on the top surface of the bottom portion 2a. The drain electrode 8 and the source-drain electrode 9 are copper plates whose lengths are the same as those of the shorter sides of the substrates 4 and 5, respectively.

A first gate electrode 10 is mounted in the position along the longer side of the substrate 4 on the top surface of the bottom portion 2a. Furthermore, a second gate electrode is 11 mounted in the position along the longer side of the substrate 5 on the top surface of the bottom portion 2a. The first gate electrode 10 and the second gate electrode 11 are copper plates whose lengths are the same as those of the longer sides of the substrates 4 and 5, respectively.

The source electrode 21 is one of the electrodes for the main current, and can be, for example, a copper plate, and is incorporated into the resin case 2. Practically, the source electrode 21 is fixed to the resin case 2 such that both tip portions are embedded into the frame portion 2c. Here, the source electrode 21 is attached to the resin case 2, as shown in FIG. 7, such that it can be mounted higher than the circuit components (the substrates 4 and 5, the semiconductor elements 6 and 7, etc.) mounted on the top surface of the heat conductive plate 3 when the resin case 2 is attached to the heat conductive plate 3. Therefore, the source electrode 21 is mounted such that it bridges over the circuit components (the substrates 4 and 5, the semiconductor elements 6 and 7, etc.) mounted on the top surface of the heat conductive plate 3. That is, the circuit can be provided in the area directly below the source electrode 21. A "circuit" includes semiconductor elements and a wiring pattern connected to the semiconductor elements. The wiring pattern includes the conductor layers 4a and 5a. As a result, the area encompassed by the resin case 2 on the top surface of the heat conductive plate 3 can be effectively utilized.

Furthermore, the source electrode 21 is attached to the resin case 2 such that it can be appropriately positioned relative to the semiconductor elements 6 and 7 when the resin case 2 is fixed to the heat conductive plate 3, that is, when the resin case 2 is fixed in a predetermined position relative to the semiconductor elements 6 and 7. An "appropriate position" refers to a position in which, for example, the source electrode 21 can be close to the source area of the semiconductor elements 7, or the distance between the source electrode 21 and each of the semiconductor elements 7 can be equally set.

Additionally, since the source electrode 21 is incorporated into the resin case 2, it is not necessary to fix it to the resin case 2 using screws, etc. Therefore, this structure contributes to the realization of a light and low-cost power module 1.

The electric connection between each semiconductor area and each electrode is made as follows. That is, bonding wires 12 connect the drain electrode 8 with the conductor layer 4a of the substrate 4, the source of each semiconductor element 6 with the conductor layer 5a of the substrate 5, the conductor layer 5a with the source-drain electrode 9, the gate of each semiconductor element 6 with the first gate electrode 10, and the gate of the semiconductor elements 7 with the second gate electrode 11. Furthermore, a bonding wire 22 connects the source of each semiconductor element 7 with the source electrode 21.

The drain electrode 8 is connected to the drain terminal (not shown in the attached drawings) which is a terminal for connection of the drain D1 of the power module 1 with an external circuit (power source, load, etc.). Similarly, the source-drain electrode 9 is connected to the source-drain terminal (not shown in the attached drawings) which is a terminal for connection of the source-drain S1D2 of the power module 1 with an external circuit. In addition, the source electrode 21 is connected to the source terminal (not shown in the attached drawings) which is a terminal for connection of the source S2 of the power module 1 with an external circuit. On the other hand, the first gate electrode 10 is connected to the first gate terminal (not shown in the attached drawings) for receiving a gate signal for control of each semiconductor element 6, and the second gate electrode 11 is connected to the second gate terminal (not shown in the attached drawings) for receiving a gate signal for control of each semiconductor element 7.

The correspondence between the power module 1 shown in FIGS. 5 through 7 and the circuit shown in FIG. 3 is described as follows. That is, the MOSFET formed by the semiconductor elements 6 corresponds to the transistor Q1, and the MOSFET formed by the semiconductor elements 7 corresponds to the transistor Q2. The drain D1 corresponds to the drain electrode 8 (or a drain terminal not shown in the attached drawings) of the power module 1, the source S2 corresponds to the source electrode 21 (or a source terminal not shown in the attached drawings), and the source-drain S1D2 corresponds to the source-drain electrode 9 (or a source-drain terminal not shown in the attached drawings). Furthermore, the first gate G1 corresponds to the first gate electrode 10 (or the first gate terminal not shown in the attached drawings) of the power module 1, and the second gate G2 corresponds to the second gate electrode 11 (of the second gate terminal not shown in the attached drawings).

The power module 1 can be used, for example, as follows. That is, the drain D1 and the source S2 are respectively connected to the positive terminal and the negative terminal of a DC power source. The gate G1 and the gate G2 are connected to the control circuit for generating a corresponding gate signal. The source-drain S1D2 is connected to a load to which power is supplied through the power module 1. When a predetermined control voltage is applied to the gate G1, the transistor Q1 is turned ON (conductivity between the drain D1 and the source-drain S1D2). On the other hand, if a predetermined control voltage is applied to the second gate G2, then the transistor Q2 is turned ON (conductivity between the source-drain S1D2 and the source S2). Therefore, by applying a predetermined control voltage to the gate G1 and the gate G2 alternately, the transistor Q1 and the transistor Q2 are alternately turned ON. As a result, an AC voltage depending on the control voltage is output from the source-drain S1D2 to a load.

When the semiconductor elements 6 and 7 are controlled to be ON state, a large current flows and heat is generated. At this time, the heat generated by the semiconductor elements 6 and 7 is transmitted to the heat conductive plate 3 via the substrates 4 and 5, thereby radiating the heat outside the power module 1.

Figure 8:
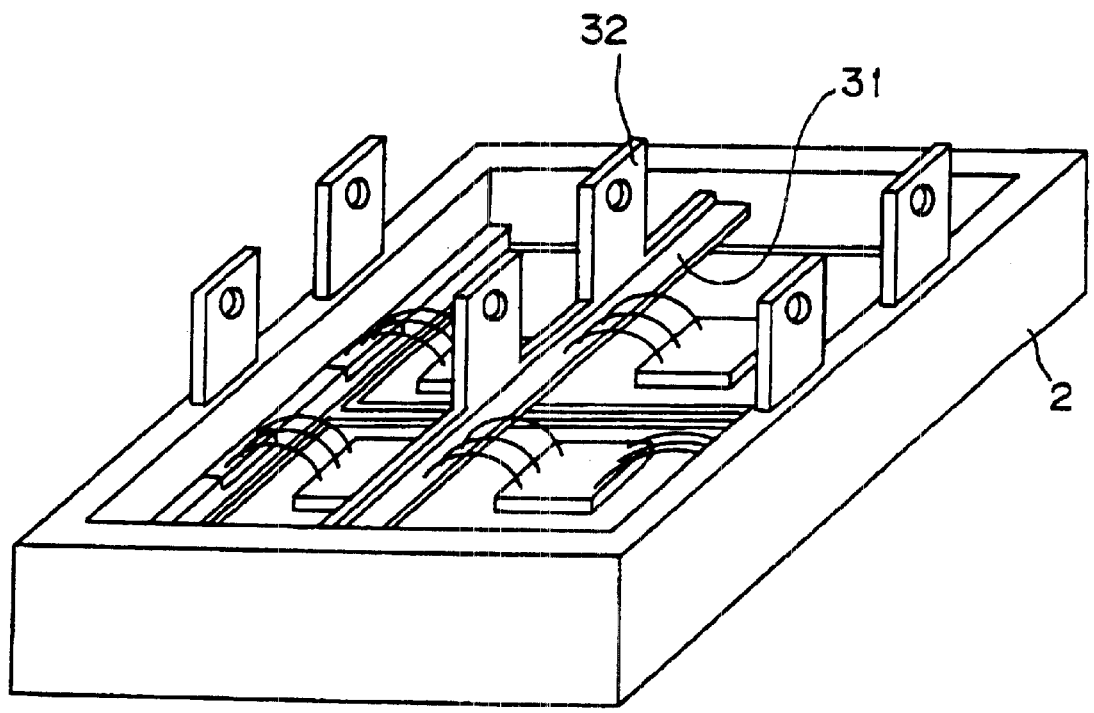
FIG. 8 is an oblique view of the semiconductor device according to another embodiment of the present invention.

FIG. 8 is an oblique view of the semiconductor device according to another embodiment of the present invention. The basic structure of the semiconductor device according to this embodiment is same as the semiconductor device shown in FIGS. 4 through 7. However, in the semiconductor device shown in FIG. 8, a bridge electrode 31 and an external terminal 32 are incorporate into a metal member. The bridge electrode 31 is an electrode for a main current of the semiconductor device, and is, for example, a source electrode. The external terminal 32 is a terminal for connecting the circuit (including semiconductor elements) formed in the semiconductor device with the circuit (such as a power source or a load) provided outside the semiconductor device, and can be, for example, a source terminal. Therefore, the semiconductor device requires no operation of electrically connecting the bridge electrode as an electrode for the main current with a corresponding external terminal, thereby simplifying the assembly task for the semiconductor device. To connect the semiconductor device with an external circuit, for example, a busbar, etc., can be connected directly to the external terminal 32.

The bridge electrode 31 is connected to corresponding semiconductor areas basically through the bonding wire as shown in FIG. 8. Practically, the resin case 2 into which the metal member including the bridge electrode 31 is incorporated is attached to the heat conductive base plate. Then, the bridge electrode 31 is connected to corresponding semiconductor areas through the bonding wire.

Figure 9:
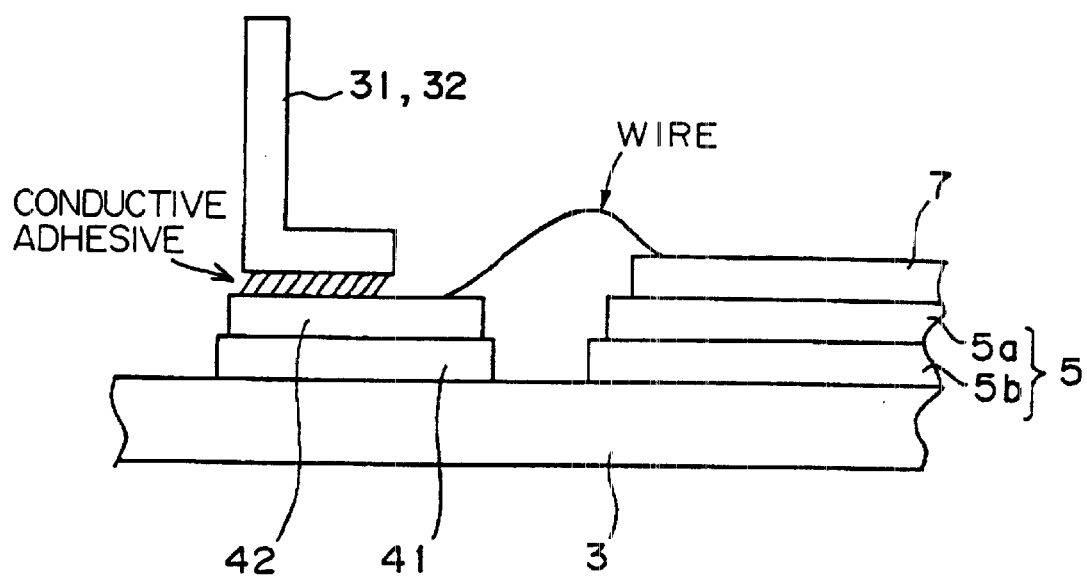
FIG. 9 shows an example of a method for connecting a bridge electrode with a corresponding semiconductor area.

However, if it is difficult to connect a bonding wire when a working space taken into account, then the bridge electrode 31 is not directly connected to a corresponding semiconductor area, but can be connected through a metal contact surface such as a land, etc. as shown in FIG. 9. That is, for example, an insulating layer 41 is provided on the top surface of the heat conductive plate 3, and a land 42 is formed on the surface of the insulating layer 41. At this time, the land 42 is located such that the bridge electrode 31 overlaps the land 42 when the resin case 2 is attached to the heat conductive plate 3. The land 42 is connected with the semiconductor area corresponding to the bridge electrode 31 through the bonding wire before the resin case 2 is attached to the heat conductive plate 3. When the resin case 2 is attached to the heat conductive plate 3, the bridge electrode 31 is either pressed directly onto the land 42 or electrically connected to the land 42 using a conductive adhesive agent, etc. In this case, it is not always necessary for the bridge electrode 31 to be mounted higher than the circuit components (substrates 4 and 5, semiconductor elements 6 and 7, etc.) mounted on the top surface of the heat conductive plate 3.

Figure 10:
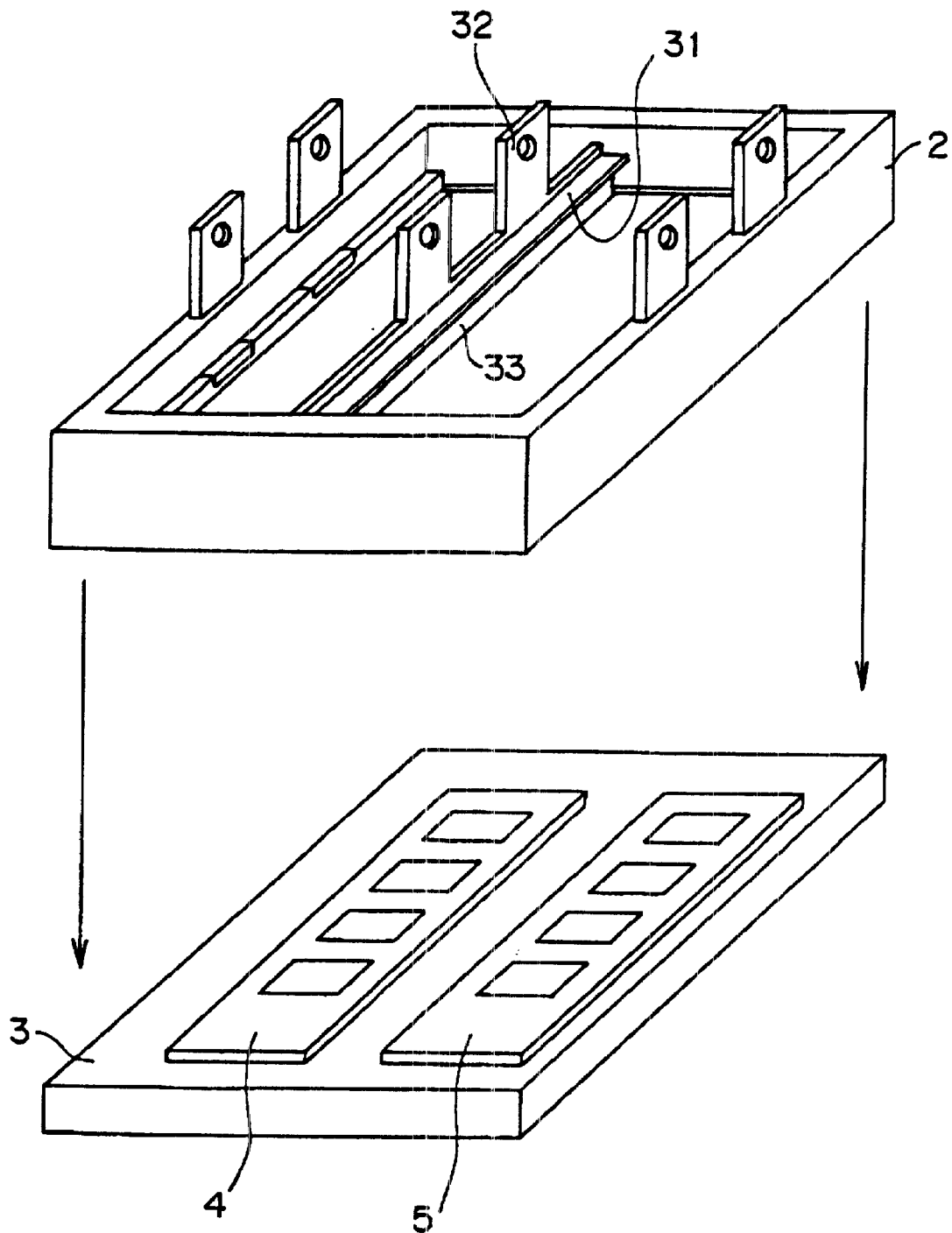
FIG. 10 is an oblique view of the semiconductor device according to still another embodiment of the present invention.
Figure 11:
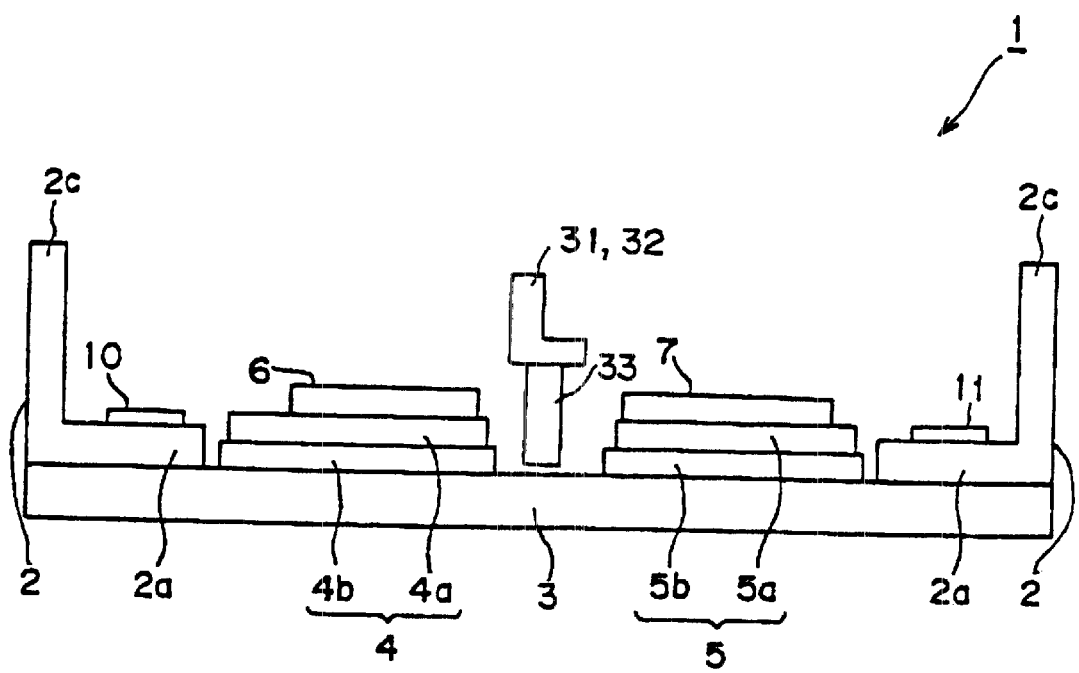
FIG. 11 is a sectional view of the semiconductor device shown in FIG. 10.

FIG. 10 is an oblique view of the semiconductor device according to still another embodiment of the present invention. FIG. 10 shows the state in which the resin case 2 has not been attached to the heat conductive plate 3 provided with the semiconductor elements 6 and 7. In this embodiment, a partitioning member (fin) 33 is formed below the bridge electrode 31. The partitioning member 33 can be made of the same material as the resin case 2, or can be formed by another material. Otherwise, the form of the bridge electrode can be the same as the form of the bridge electrode 31 provided with the partitioning member 33. In this case, insulation between the bridge electrode 31 and adjacent parts is required. The partitioning member 33 is incorporated into the resin case 2. If the resin case 2 is fixed to the heat conductive plate 3, then the partitioning member 33 has the surface area of the heat conductive plate 3 divided into two areas as shown in FIG. 11.

The partitioning member 33 has the function of avoiding the disconnection, etc., of the bonding wire by the shaking of a gel. That is, a gel is filled to protect the semiconductor elements 6 and 7 in the inner area of the resin case 2 in the final process performed when a semiconductor device is assembled. At this time, if the gel is shaken for any reason, a tension is applied to the wire, and there is a possibility of a disconnection. However, in the semiconductor device shown in FIG. 10, the partitioning member 33 protects the gel against the shaking, thereby reducing the possibility of a disconnection.

The semiconductor device according to the present embodiment, described above with reference to FIGS. 3 through 11, has the following effects.

(1) Since a circuit can be located below the source electrode 21, the source electrode 21 can be placed in a desired position, thereby realizing a smaller power module 1.

(2) Since the power module 1 can be smaller and the inner current path can be shortened, the inductance in the device can be reduced and the internal surges can also be reduced. As a result, a power module can be configured with a larger capacity.

(3) Since the source electrode 21 is incorporated into the resin case 2, the source electrode 21 can be closer to corresponding semiconductor elements by attaching the resin case 2 to the heat conductive plate 3. Therefore, the assembly task of the semiconductor device can be simplified.

(4) Since the bridge electrode 31 and the external terminal 32 are incorporated into a single member, the external terminal can be provided in a desired position, thereby shortening the distance between the semiconductor element and the external terminal. Furthermore, the operation of the assembly task for the semiconductor device can be simplified.

(5) The possibility of a disconnection due to the shaking gel in the bonding wire can be reduced by providing partitioning members.

(6) Since all wire bonding operations can be completed before attaching the case to the substrate, the assembly task can be simplified.

The semiconductor device according to the present invention is not limited to the above mentioned embodiments, but can be configured, for example, as follows.

(a) The configuration of semiconductor elements is not limited to forming the drain of the MOSFET on one surface, and the source and the gate on the other surface. For example, the drain, source, and gate can be formed on one surface of the semiconductor chip, and the wire can connect each semiconductor area with a corresponding electrode. In this case, the substrates 4 and 5 can be configured only by insulating layers.

(b) The number of semiconductor elements connected in parallel can be selected depending on the required power capacity.

(c) The semiconductor device is not limited to the circuit module configured by a set of switching devices, but can be a circuit module configured by a larger number of switching devices.

(d) The configuration is not limited to the source electrode 21 above the heat conductive plate 3, but can be another electrode for a main current (such as drain electrode, source-drain electrode) mounted above the semiconductor elements. In this case, the wiring pattern in the semiconductor device can be determined depending on the layout of each electrode.

(e) The configuration is not limited to the source electrode 21 above the heat conductive plate 3, but can be two or more electrodes in the source electrodes, the drain electrodes, and the source-drain electrodes mounted above the semiconductor elements. In this case, the semiconductor device can be smaller.

(f) The semiconductor elements are not limited to MOSFET, but can be, for example, bi-polar transistors, thyristor, etc. In this case, a semiconductor device can be configured using semiconductor elements depending on the circuit specification. The semiconductor device can also be configured to include a plurality of types of semiconductor elements.

(g) The configuration is not limited to connecting each component in the semiconductor device through wire bonding, but can be the configuration of connecting wire using soldering, the configuration of connecting a joined metal plate, etc.

(h) The heat conductive plate 3 as a heat conductive member can be a ceramics material other than C-Al. The material is not limited to ceramics, but can be any other material of high heat conductivity. For example, heat conductive metal such as copper, aluminum, etc., can be used.

(i) The shape of a heat conductive member is not limited to a plate. For example, a heat conductive member can include a fin extending outward when viewed from the semiconductor device.

(j) The semiconductor device is not limited to the configuration having a heat conductive member, but can have a semiconductor element joined to a resin case without a heat conductive member. This configuration can be applied when low heat-producing semiconductor elements are used. In this case semiconductor elements can be produced in labor- and cost-saving operations.

(k) The material of each electrode is not limited to copper.

(l) A metal case can replace the resin case. In this case, each electrode can be attached to the metal case, for example, through an insulating member.

(m) A bridge electrode does not have to be linear shape, but can be of any shape. For example, the shape of the bridge electrode can be determined such that the distance between the bridge electrode and the semiconductor elements is as short as possible.

(n) The number of bridge electrodes is not limited to one, and a plurality of bridge electrodes can be provided for one semiconductor device.

(o) A resin case can be fixed to a substrate, and does not have to be fixed to a heat conductive base plate.

(p) The semiconductor elements are not to be arranged in one or more rows. For example, the arrangements of the semiconductor elements can be determined depending on the shape of the electrode such that, for example, the distance between the electrode and the semiconductor elements is as short as possible.

According to the present invention, a circuit can be provided under an electrode for the main current. Therefore, a smaller power module can be realized. Additionally, since an electrode for the main current is incorporated into the case, the assembly task for the semiconductor device can be simplified.

What is claimed is:

1. A semiconductor device, comprising:

semiconductor elements;

a case mounted so as to encompass said semiconductor elements; and an electrode, incorporated into said case, for a main current of said semiconductor elements, wherein
        when said case is fixed to a predetermined position relative to said semiconductor elements, said electrode is mounted to bridge an area in which said semiconductor elements are provided.

2. The semiconductor device according to claim 1, wherein
    a terminal for electrically connecting said semiconductor device with an external circuit of said semiconductor device is incorporated into said electrode.

3. The semiconductor device according to claim 1, wherein
    said electrode is connected to said semiconductor element through wire bonding.

4. The semiconductor device according to claim 1, wherein
    said electrode is directly or indirectly in contact with a metal contact surface provided in a predetermined position relative to said semiconductor elements, and the metal contact surface is connected to said semiconductor elements through wire bonding.

5. The semiconductor device according to claim 1, wherein
    a partitioning member for sectioning an internal area of said case into a plurality of areas is provided on a bottom surface of said electrode.

6. A semiconductor device, comprising:

a base plate;

semiconductor elements provided on said base plate;

a case mounted so as to encompass said semiconductor elements; and an electrode, incorporated into said case, for a main current of said semiconductor elements, wherein
        said electrode bridges over a circuit including said semiconductor elements.

* * * * *

UNITED STATES PATENT AND TRADEMARK OFFICE
CERTIFICATE OF CORRECTION

PATENT NO. : 6,664,629 B2
DATED : December 16, 2003
INVENTOR(S) : Maeno

It is certified that error appears in the above-identified patent and that said Letters Patent is hereby corrected as shown below:

<u>Column 4,</u>
Line 30, please delete "portion 2*a* c contacts" and insert therefore -- portion 2*a* contacts --.

Signed and Sealed this

Sixteenth Day of March, 2004

JON W. DUDAS
*Acting Director of the United States Patent and Trademark Office*